(12) United States Patent
Kamitani et al.

(10) Patent No.: US 9,374,039 B2
(45) Date of Patent: Jun. 21, 2016

(54) POWER AMPLIFIER

(71) Applicant: Panasonic Intellectual Property Management Co., Ltd., Osaka (JP)

(72) Inventors: Masatoshi Kamitani, Osaka (JP); Kazuya Wakita, Aichi (JP); Shingo Enomoto, Osaka (JP); Masato Seki, Ehime (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/951,071

(22) Filed: Nov. 24, 2015

(65) Prior Publication Data
US 2016/0079927 A1 Mar. 17, 2016

Related U.S. Application Data

(63) Continuation of application No. PCT/JP2014/002079, filed on Apr. 11, 2014.

(30) Foreign Application Priority Data

Jun. 19, 2013 (JP) .................................. 2013-128224

(51) Int. Cl.
*H03G 3/30* (2006.01)
*H03F 1/30* (2006.01)
(Continued)

(52) U.S. Cl.
CPC ................ *H03F 1/0205* (2013.01); *H03F 1/30* (2013.01); *H03F 3/19* (2013.01); *H03F 3/21* (2013.01); *H03F 2200/451* (2013.01); *H03F 2200/555* (2013.01)

(58) Field of Classification Search
CPC .......... H03G 3/30; H03G 3/3042; H03F 1/30; H03F 1/302; H03F 1/0261; H03F 3/04; H03F 2200/18; H03F 1/301; H03F 2200/447
USPC .................. 330/285, 296, 289, 256, 266, 272
See application file for complete search history.

(56) References Cited

U.S. PATENT DOCUMENTS

| 5,438,298 A | 8/1995 | Hori | |
|---|---|---|---|
| 8,717,101 B2 * | 5/2014 | Li | ........................ H03G 3/007 330/278 |

(Continued)

FOREIGN PATENT DOCUMENTS

| JP | 63-269815 | 11/1988 |
|---|---|---|
| JP | 6-216659 | 8/1994 |

(Continued)

OTHER PUBLICATIONS

International Search Report of PCT application No. PCT/JP2014/002079 dated Jul. 15, 2014.

*Primary Examiner* — Hieu Nguyen
(74) *Attorney, Agent, or Firm* — McDermott Will & Emery LLP

(57) ABSTRACT

A power amplifier includes an amplification transistor which performs power amplification, a bias circuit which outputs a bias voltage to a base of the amplification transistor, a control terminal to which a control voltage is applied for controlling switching between an operating state and a stopping state of the bias circuit, and a bias voltage adjustment circuit connected to the control terminal. The bias voltage adjustment circuit includes a variable capacitance element which is connected to the control terminal and whose capacitance value decreases as the control voltage increases, a discharge circuit which discharges electric charge accumulated in the variable capacitance element to the control terminal, and a control circuit which is connected to the bias circuit and controls the bias voltage. The bias voltage adjustment circuit outputs, to the bias circuit, a bias voltage adjustment signal which increases the bias voltage for a predetermined period after the control voltage is applied.

11 Claims, 7 Drawing Sheets

(51) Int. Cl.
*H03F 1/02* (2006.01)
*H03F 3/19* (2006.01)
*H03F 3/21* (2006.01)

(56) References Cited

U.S. PATENT DOCUMENTS

2008/0002983 A1 1/2008 Ishikawa et al.
2009/0212863 A1 8/2009 Ishimaru
2013/0293311 A1 11/2013 Wakita et al.

FOREIGN PATENT DOCUMENTS

| | | |
|---|---|---|
| JP | 2008-011086 | 1/2008 |
| JP | 2009-200770 | 9/2009 |
| WO | 2012/111274 | 8/2012 |

* cited by examiner

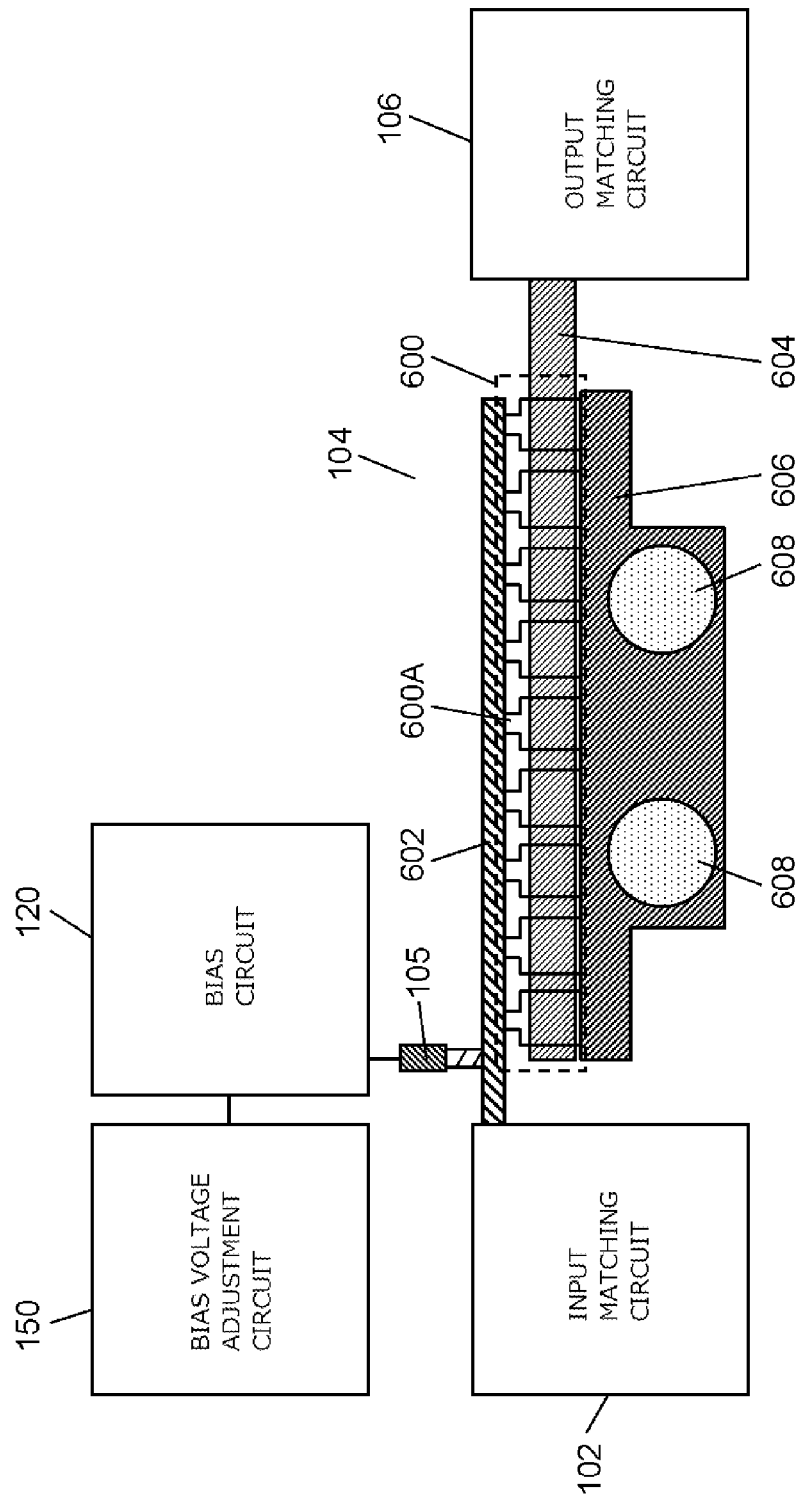

POWER AMPLIFIER

RELATED APPLICATIONS

This application is a Continuation of International Application No. PCT/JP2014/002079, filed on Apr. 11, 2014, which in turn claims priority from Japanese Patent Application No. 2013-128224, filed on Jun. 19, 2013, the contents of all of which are incorporated herein by reference in their entireties.

BACKGROUND

1. Field of the Invention

The present disclosure relates to a power amplifier and relates to, for example, a high frequency power amplifier used for a wireless communication device or the like.

2. Description of the Related Art

In recent years, mobile communication device such as portable phones are used as information communication means not only for talking but also for transmitting and receiving various data such as mail and contents. Along with this situation, portable phones also have come to be equipped with a wireless LAN (Local Area Network) or the like.

As a modulation wave for high-speed data communication with a wireless LAN, the OFDM (Orthogonal Frequency Division Multiplexing) method is used. Because a system using the OFDM needs high modulation accuracy, a high frequency power amplifier is required to have high linearity. Therefore, the high frequency power amplifier is designed to be used in a linear amplification region in which output is sufficiently smaller than a maximum output.

However, if the number of transistors or a size of the transistor is increased in order to increase the maximum output of the high frequency power amplifier, thermal response of the amplifier becomes slow. For this reason, it takes some time since temperature of the amplifier starts to increase due to heat generation of the amplification transistor just after start-up of the amplifier until the temperature becomes stable. A gain and a phase of the amplifier change while the temperature is increasing, and these changes also can be a cause for fatal deterioration of an EVM (Error Vector Magnitude) in the OFDM.

In order to solve the above problem, a power amplifier as shown in FIG. 7 is proposed in International Publication WO2012/111274. The power amplifier shown in FIG. 7 includes capacitance element 501 whose first end is connected to control terminal 200 through which a control voltage is supplied, time constant control circuit 180 connected to a second end of capacitance element 501, discharge circuit 160 connected in parallel with capacitance element 501, and bias circuit 120 connected to time constant control circuit 180 and temperature compensation circuit 130.

When the control voltage rises, capacitance element 501 is charged, and a charge current caused by electric charge for the charging flows through resistor 192. This operation transiently increases a voltage output from temperature compensation circuit 130, and a bias for amplification transistor 104 can thus be transiently increased. Accordingly, a gain of the amplifier temporarily increases, and it is possible to shorten a time period until temperature fluctuation due to heat generated by amplification transistor 104 reaches an equilibrium state in the whole circuit. As a result, it is possible to reduce deterioration of the EVM caused by the temperature fluctuation due to the heat generated by amplification transistor 104 just after the start-up of the amplifier.

SUMMARY

A power amplifier according to an aspect of the present disclosure includes an amplification transistor which performs power amplification, a bias circuit which outputs a bias voltage to a base of the amplification transistor, a control terminal to which a control voltage is applied for controlling switching between an operating state and a stopping state of the bias circuit, and a bias voltage adjustment circuit connected to the control terminal. The bias voltage adjustment circuit includes a variable capacitance element which is connected to the control terminal and whose capacitance value decreases as the control voltage increases, a discharge circuit which discharges electric charge accumulated in the variable capacitance element to the control terminal, and a control circuit which is connected to the bias circuit and controls the bias voltage. The bias voltage adjustment circuit outputs, to the bias circuit, a bias voltage adjustment signal which increases the bias voltage for a predetermined period after the control voltage is applied.

According to the present disclosure, by using the variable capacitance element in the bias voltage adjustment circuit, an amount of electric charge being charged into the variable capacitance element from the control voltage can be substantially constant regardless of an amplitude of the control voltage. As a result, it is possible to reduce an influence of a variation of the amplitude of the control voltage to transient response characteristics of the amplification transistor; thus, the deterioration of the EVM can be reduced. The present disclosure can be applied to power amplifiers other than high frequency power amplifiers.

BRIEF DESCRIPTION OF DRAWINGS

FIG. 2 is a diagram showing a part of a layout of the power amplifier according to the first exemplary embodiment;

DETAILED DESCRIPTION OF THE PREFERRED EMBODIMENTS

Figure 1:
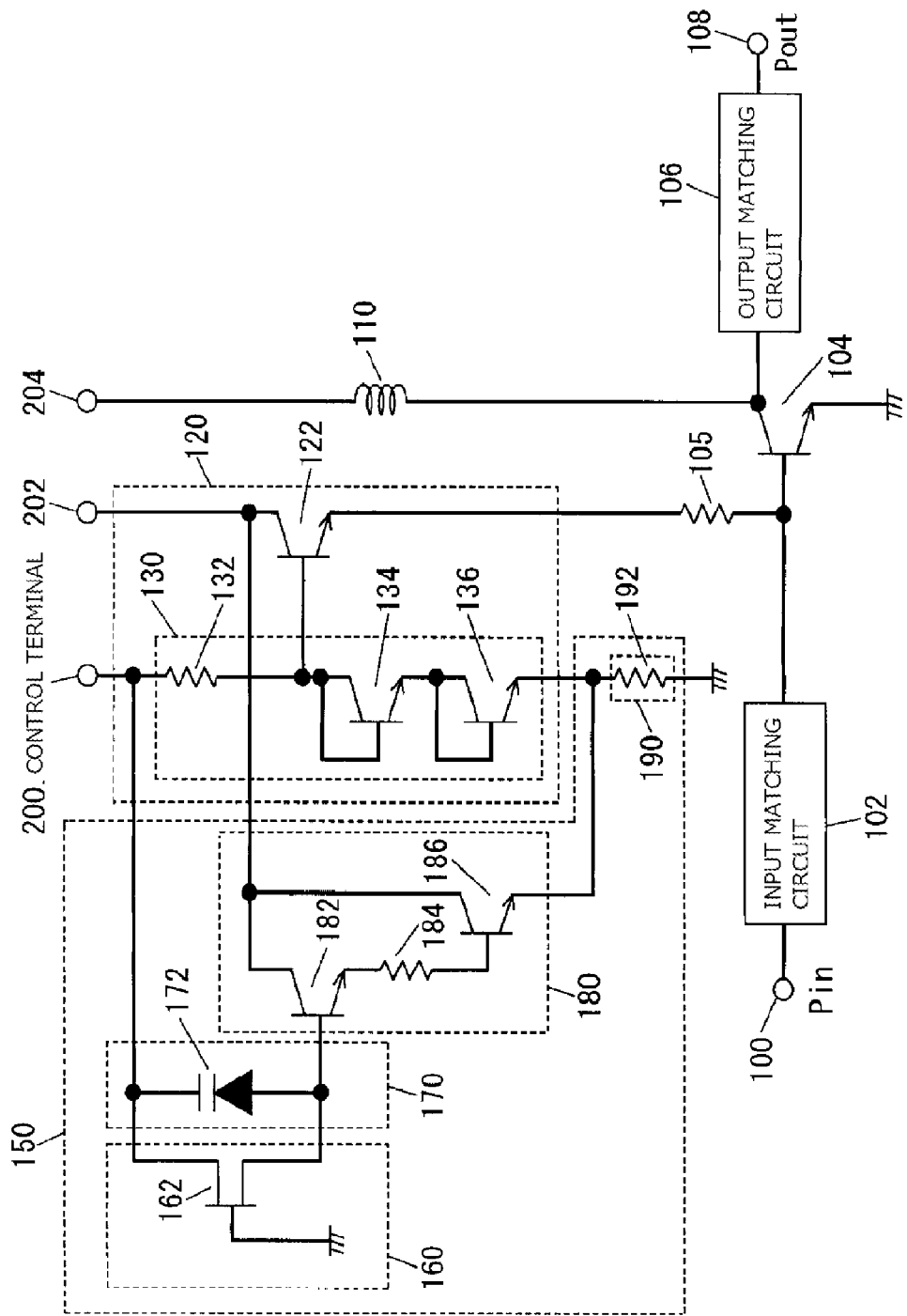
FIG. 1 is a circuit diagram of a power amplifier according to a first exemplary embodiment.

Since a capacitance of capacitance element 501 is constant in the power amplifier shown in International Publication WO2012/111274, a charge amount depends on a value of the control voltage. That is to say, transient response characteristics of amplification transistor 104 fluctuate depending on the amplitude of the control voltage from outside. As a result, the power amplifier described in International Publication WO2012/111274 has a problem that deterioration of the EVM is created due to the variation of the amplitude of the control voltage.

The present disclosure provides a power amplifier which can solve the above problem.

In the following, the present disclosure will be described with reference to the drawings. The present disclosure is not limited to the following exemplary embodiments. Further, substantially the same component is assigned the same reference numeral and is not described in some cases.

First Exemplary Embodiment

FIG. 1 is a circuit diagram of a power amplifier according to a first exemplary embodiment.

The power amplifier of the present exemplary embodiment includes input terminal 100, output terminal 108, input matching circuit 102, output matching circuit 106, amplification transistor 104, stabilizing resistor 105, bias circuit 120, bias voltage adjustment circuit 150, control terminal 200, bias power source terminal 202, collector power source terminal 204, and choke coil 110.

Input terminal 100 is connected to a base of amplification transistor 104 through input matching circuit 102, an emitter of amplification transistor 104 is grounded, and a collector of amplification transistor 104 is connected to collector power source terminal 204 through choke coil 110 and connected to output terminal 108 through output matching circuit 106.

Bias circuit 120 includes bias transistor 122 which biases amplification transistor 104, and a temperature compensation circuit 130. A collector of bias transistor 122 is connected to bias power source terminal 202. An emitter of bias transistor 122 is connected to a base of amplification transistor 104 through stabilizing resistor 105.

Temperature compensation circuit 130 includes resistor 132, transistor 134, and transistor 136. A first end of resistor 132 is connected to control terminal 200. A second end of resistor 132 is connected to a base of bias transistor 122 and connected to a collector and a base of transistor 134. An emitter of transistor 134 is connected to a collector and a base of transistor 136.

Bias voltage adjustment circuit 150 includes discharge circuit 160, variable capacitance element 170, time constant control circuit 180, and control circuit 190. Discharge circuit 160 includes field-effect transistor 162. Field-effect transistor 162 is preferably of an n-channel type. Field-effect transistor 162 may be of a p-channel type. Variable capacitance element 170 includes variable capacitance diode 172. Time constant control circuit 180 includes transistor 182, resistor 184 connected to an emitter of transistor 182, and transistor 186. Control circuit 190 may be a circuit which can control a voltage being output from bias circuit 120, and control circuit 190 includes resistor 192 in the present exemplary embodiment. Control circuit 190 may be a diode.

A first end of resistor 192 is grounded, a second end of resistor 192 is connected to an emitter of transistor 136 and an emitter of transistor 186. A base of transistor 186 is connected to the emitter of transistor 182 through resistor 184. Collectors of transistor 182 and transistor 186 are connected to bias power source terminal 202.

A cathode of variable capacitance diode 172 is connected to control terminal 200, and an anode of variable capacitance diode 172 is connected to a base of transistor 182. Regarding field-effect transistor 162, a gate is grounded, a drain is connected to control terminal 200, and a source is connected to the base of transistor 182.

In the power amplifier shown in FIG. 1, a signal having been input from input terminal 100 is input to amplification transistor 104 through input matching circuit 102 and amplification transistor 104 performs power amplification of the signal. The amplified high frequency signal is output to output terminal 108 through output matching circuit 106. In the present exemplary embodiment, a case will be described as an example in which the signal is a high frequency signal.

At the same time, when the control voltage applied to control terminal 200 rises, a charge current flows until charging of variable capacitance diode 172 is completed; thus, also in transistor 182 and transistor 186, current flows from the collectors to the emitters, and the current flows into resistor 192.

The current transiently increases a base potential of bias transistor 122, and a bias voltage to amplification transistor 104 is thus increased transiently. Therefore, a gain of the amplifier is temporarily increased, and the increase in the gain shortens a time period until temperature fluctuation due to the heat generated by amplification transistor 104 reaches an equilibrium state in the whole circuit. As a result, it is possible to reduce deterioration of the EVM caused by the temperature fluctuation due to the heat generated by amplification transistor 104 just after the start-up of the amplifier.

At this time, a resistance value of resistor 192 is designed to be sufficiently small with respect to a resistance value of resistor 184 to an extent that the resistance value of resistor 192 does not affect a time constant until completion of charging of variable capacitance diode 172. Specifically, the resistance value of resistor 184 only has to be thousands times the resistance value of resistor 192 or more.

When the control voltage falls, the electric charge charged in variable capacitance diode 172 is discharged by field-effect transistor 162.

Equation 1 expresses a relationship between a capacitance of the variable capacitance diode and a voltage.

$$Cdiode = \sqrt{\left(\frac{q\varepsilon}{2} \cdot \frac{N_A N_D}{N_A + N_D} \cdot \frac{1}{\phi_{Bi} + V}\right)} \quad \text{[Equation 1]}$$

where:
q is an elementary charge;
$\varepsilon$ is a dielectric constant of the depletion layer;
$N_A$ is an acceptor density;
$N_D$ is a donor density;
$\phi_{Bi}$ is a built-in voltage; and
V is a voltage applied to the variable capacitance diode (control voltage).

That is to say, variable capacitance diode 172 has characteristics: that, as the control voltage increases, the depletion layer width increases and the capacitance value thus decreases; and that, as the control voltage decreases, the depletion layer width decreases and the capacitance value thus increases. With these characteristics, the amount of electric charge being charged into variable capacitance diode 172 at the time when the control voltage rises is substantially constant regardless of the control voltage. Here, the terms "substantially constant" have a meaning which includes changes by fluctuation of characteristics due to manufacturing errors of variable capacitance diode 172.

Bias voltage adjustment circuit 150 transiently increases an idle current of amplification transistor 104. That is to say, bias voltage adjustment circuit 150 outputs to bias circuit 120 a bias voltage adjustment signal which increases a bias voltage to amplification transistor 104. A magnitude of the bias voltage adjustment signal is determined by control circuit 190, depending on the amount of the electric charge accumulated in variable capacitance element 170.

Time constant control circuit 180 sets, using the value of resistor 184, a predetermined period in which bias voltage adjustment circuit 150 outputs the bias voltage adjustment signal to the base of amplification transistor 104.

FIG. 2 is a diagram showing a layout of amplification transistor 104 in FIG. 1 and the peripheral area. As shown in FIG. 2, amplification transistor 104 is configured with a plurality of mutually connected transistors 600 formed on a semiconductor chip.

Specifically, bases of the plurality of transistors 600 are connected to each other through base wire 602. Collectors of the plurality of transistors 600 are connected to each other through collector wire 604, and collector wire 604 is connected to output matching circuit 106. Emitters of the plurality of transistors 600 are connected to each other through emitter wire 606 and are grounded through via holes 608.

Figure 3A:
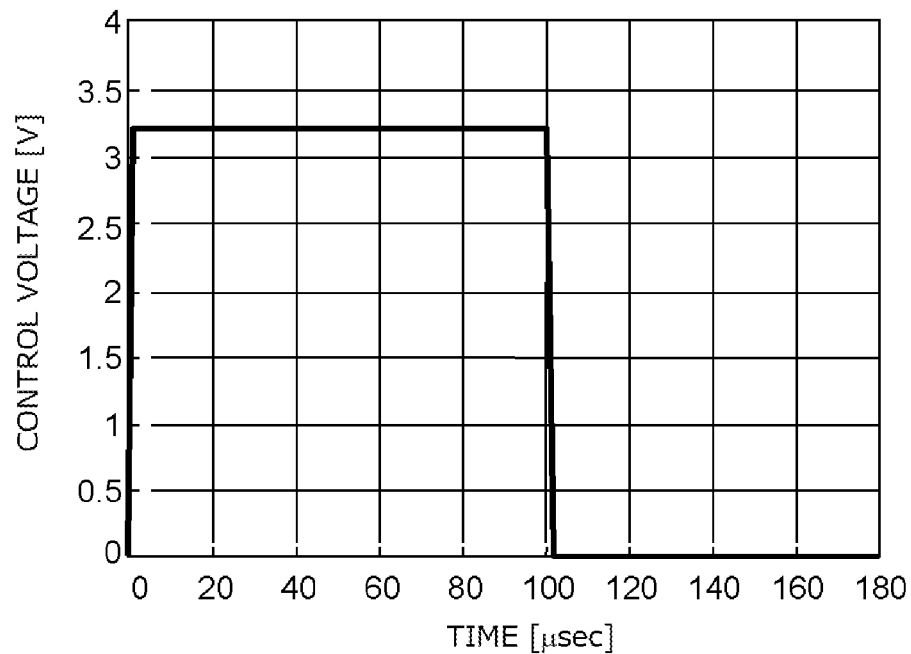
FIG. 3A is a graph showing a relationship between a control voltage and time.
Figure 3B:
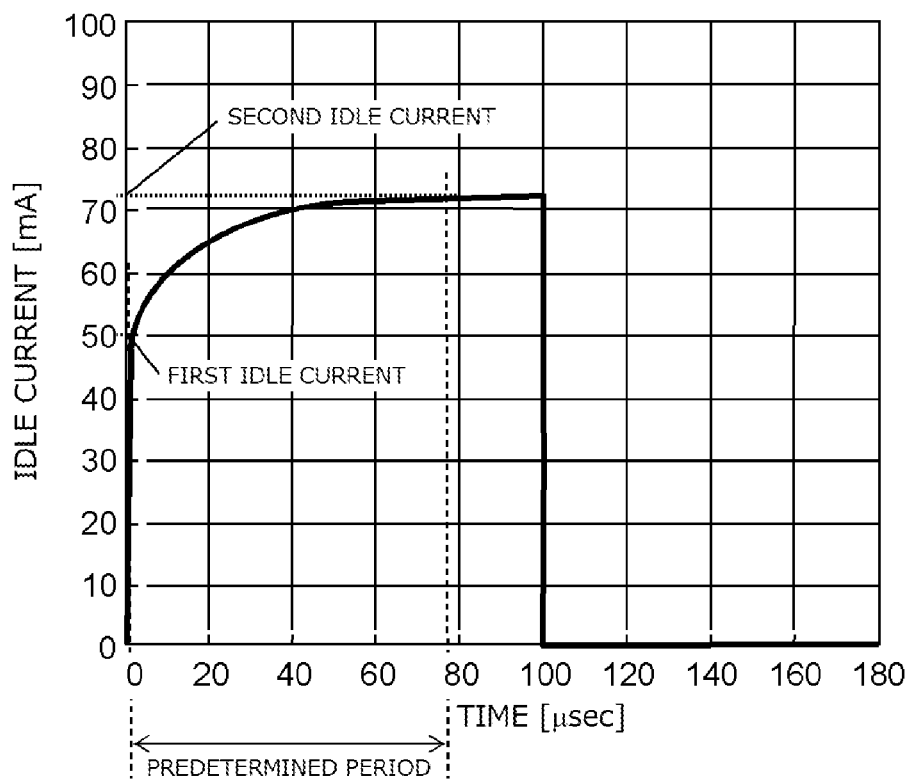
FIG. 3B is a graph showing a relationship between an idle current of an amplification transistor and time.

FIG. 3A and FIG. 3B are graphs showing a relationship between the control voltage (3.2 V) and the idle current of amplification transistor 104 when a high frequency signal is not input in the case that bias voltage adjustment circuit 150 is not provided. As shown in FIG. 3A and FIG. 3B, the above-described predetermined period is a time period since the control voltage is applied until a first idle current, which is an idle current flows at the time when the control voltage is applied to the control terminal, reaches a second idle current in a state in which thermal equilibrium is attained due to heat transfer on the semiconductor chip. Here, a plurality of transistors 600 start to generate heat when the control voltage is applied to the control terminal and the first idle current starts to flow.

Next, it will be described how the relationship between the control voltage and the idle current of amplification transistor 104 changes in the case that bias voltage adjustment circuit 150 is provided.

As an comparative example, there will be described an example of the simulation results of the transient response characteristics of the idle current of amplification transistor 104, of the power amplifier of FIG. 7 described in International Publication WO2012/111274, in the state that a high frequency signal is not input.

Figure 4:
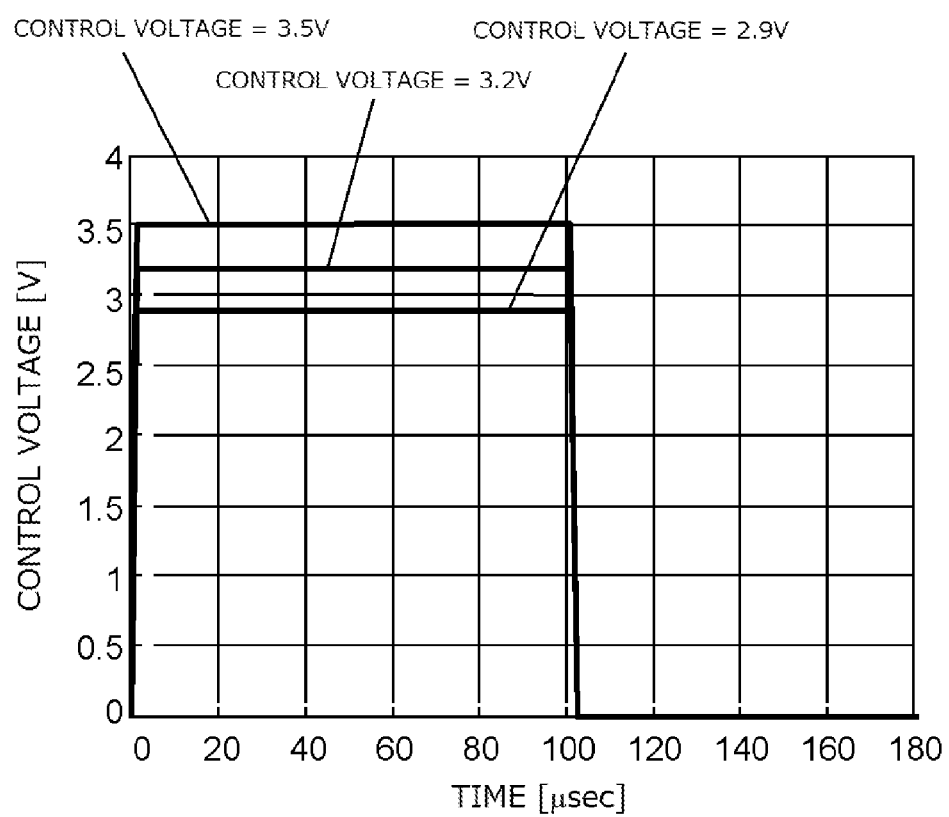
FIG. 4 is a graph showing a control voltage applied to a control terminal of the power amplifier.

FIG. 4 shows the control voltage applied to control terminal 200. The vertical axis represents the control voltage [V], and the horizontal axis represents time [μsec]. The control voltages are voltage pulse signals with a pulse width of 100 μsec, a duty ratio of 50%, and have an amplitude of 2.9 V, 3.2 V, 3.5 V, respectively.

Discussion will be made taking as an example a power amplifier in which intended transient response characteristics can be obtained with the control voltage of 3.2 V.

Figure 5A:
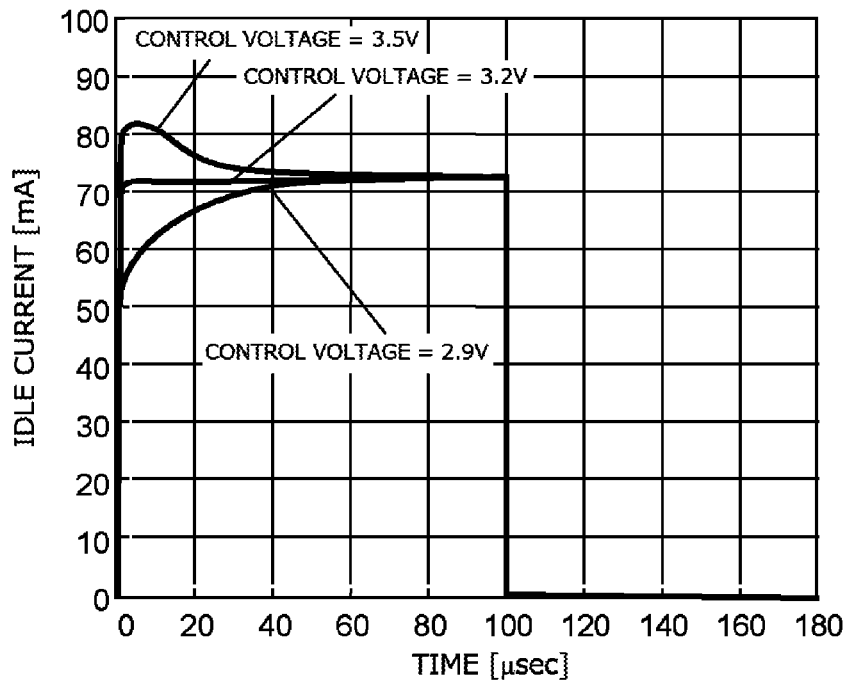
FIG. 5A is a graph showing an example of transient response characteristics of a conventional power amplifier.
Figure 7:
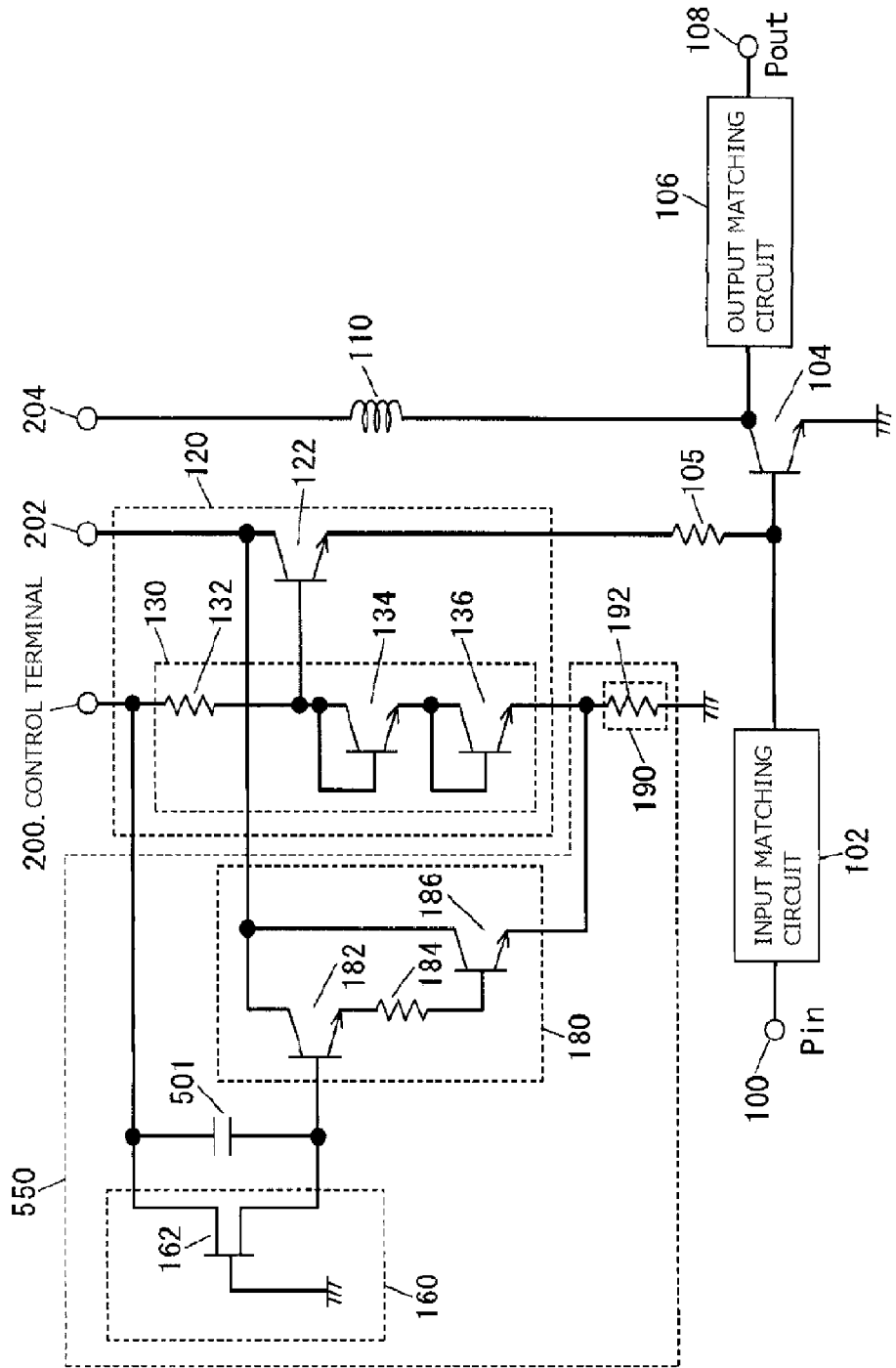
FIG. 7 is a circuit diagram of a conventional power amplifier.

First, with respect to the power amplifier of FIG. 7, FIG. 5A shows an example of simulation results of the transient response characteristics of the idle current of amplification transistor 104 in the state that a high frequency signal is not input.

The amount of electric charge being charged into capacitance element 501 shown in FIG. 7 from the control voltage depends on the amplitude of the control voltage. Therefore, when the control voltage is lower than 3.2 V (for example, when the control voltage is 2.9 V), a current flowing into control circuit 190 is insufficient; therefore, the base potential of bias transistor 122 does not increase sufficiently. As a result, the amount by which bias voltage adjustment circuit 550 transiently increases the idle current of amplification transistor 104 decreases; thus, bias voltage adjustment circuit 550 cannot compensate slowness of thermal response of amplification transistor 104.

To the contrary, when the control voltage is higher than 3.2 V (for example, when the control voltage is 3.5 V), the amount by which bias voltage adjustment circuit 550 transiently increases the idle current of amplification transistor 104 is excessive; therefore, bias voltage adjustment circuit 550 excessively compensates the slowness of the thermal response of amplification transistor 104. This will be a cause of change in the gain and the phase just after the start-up of the amplifier and will thus be a cause of distortion or deterioration of the EVM.

Figure 5B:
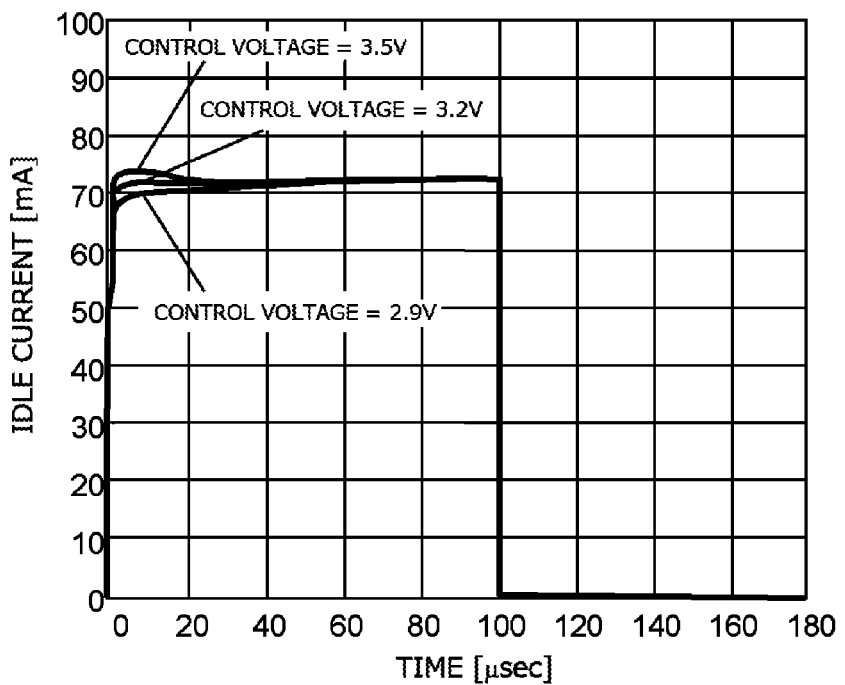
FIG. 5B is a graph showing an example of transient response characteristics of the power amplifier according to the first exemplary embodiment.

Next, FIG. 5B shows an example of the simulation results of the transient response characteristics of the idle current of amplification transistor 104, of the power amplifier of FIG. 1, in the state that a high frequency signal is not input. As the control voltage, the control voltage shown in FIG. 4 is applied in the same way as the comparative example.

In the present exemplary embodiment, as the control voltage increases, the depletion layer width increases, and the capacitance value of variable capacitance diode 172 thus decreases; and as the control voltage decreases, the depletion layer width decreases, and the capacitance value of variable capacitance diode 172 thus increases. That is to say, because the amount of electric charge being charged into variable capacitance diode 172 is substantially constant with the control voltages of 2.9 V and 3.5 V, the amount by which bias voltage adjustment circuit 150 transiently increases the idle current of amplification transistor 104 is substantially the same. With this feature, regardless of variation of the amplitude of the control voltage applied to control terminal 200, amplification transistor 104 can amplify the high frequency signal having been input from input terminal 100 while reducing the variation; thus, the deterioration of the EVM can be reduced.

Second Exemplary Embodiment

Figure 6:
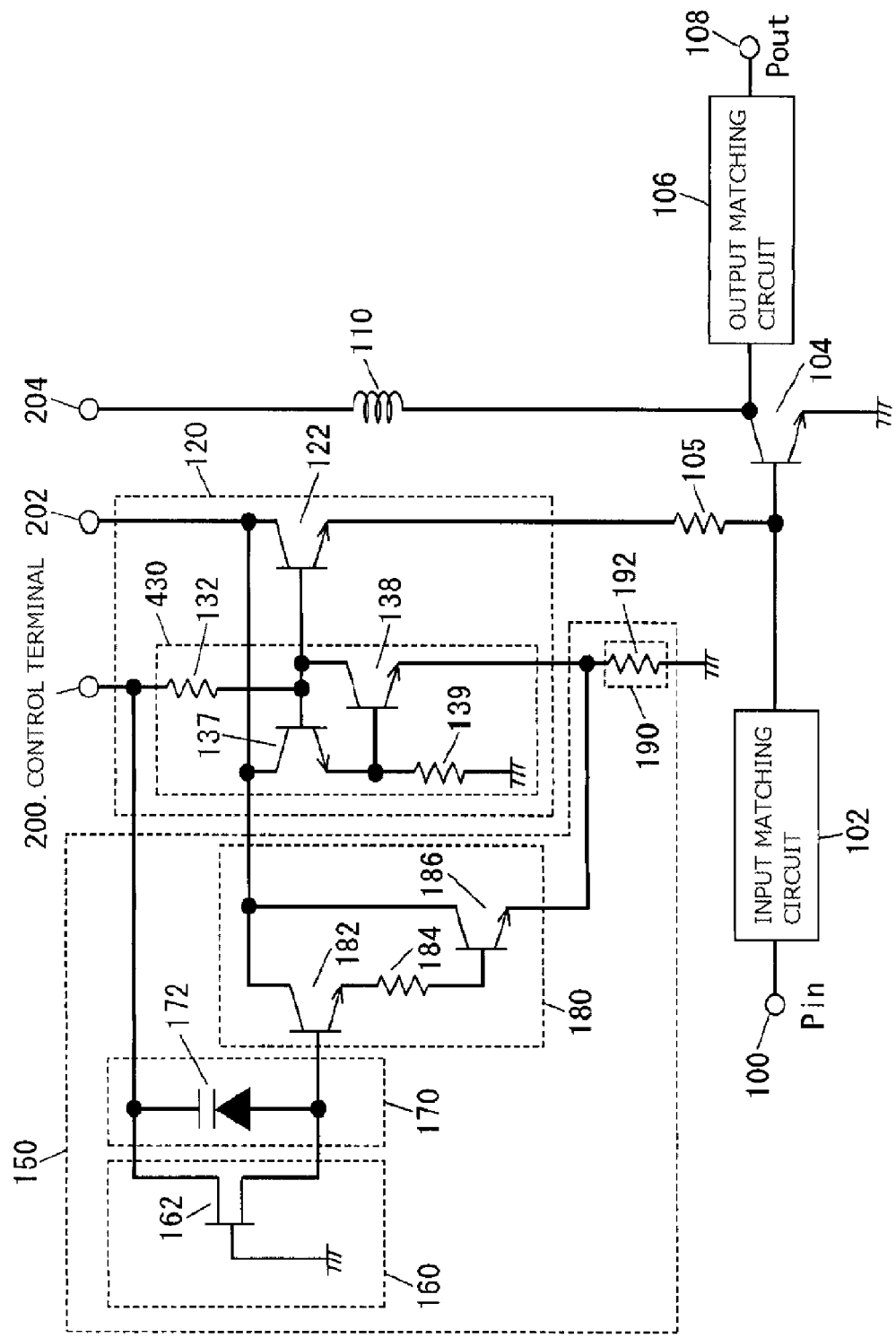
FIG. 6 is a circuit diagram of a power amplifier of a second exemplary embodiment.

FIG. 6 shows a circuit diagram of a power amplifier of a second exemplary embodiment.

Temperature compensation circuit 430 of the power amplifier shown in FIG. 6 includes transistor 137, transistor 138, resistor 132, and resistor 139. A first end of resistor 132 is connected to control terminal 200. A second end of resistor 132 is connected to a base of bias transistor 122, a base of transistor 137, and a collector of transistor 138.

A collector of transistor 137 is connected to a collector of bias transistor 122, a collector of transistor 182, and a collector of transistor 186. An emitter of transistor 137 is connected to a base of transistor 138 and is grounded through resistor 139 one end of which is grounded. The emitter of transistor 138 is grounded through resistor 192.

Also regarding the power amplifier shown in FIG. 6, when the control voltage applied to control terminal 200 rises, a charge current flows until charging of variable capacitance diode 172 is completed; thus, also regarding transistor 182 and transistor 186, current flows from the collectors to the emitters, and the current flows into resistor 192.

Therefore, the emitter potential of transistor 138 increases, and a current flowing into the collector of transistor 137 thus decreases, whereby the base potential of bias transistor 122 increases. Therefore, a bias to amplification transistor 104 is transiently increases; thus, a gain of the amplifier increases temporarily.

As a result, it is possible to shorten a time period until a temperature fluctuation caused by the heat generated by amplification transistor 104 reaches an equilibrium state in the whole circuit; thus, it is possible to reduce the deterioration of the EVM due to the temperature fluctuation caused by the heat generated by the amplification transistor just after the start-up of the amplifier.

Further, similarly to the power amplifier shown in FIG. 1, also in the power amplifier shown in FIG. 6, the amount of electric charge being charged into variable capacitance diode 172 when the control voltage rises is substantially constant regardless of the control voltage; therefore, also the amount by which bias voltage adjustment circuit 150 transiently increases the idle current of amplification transistor 104 does not change.

Note that a "first resistor" of the present disclosure corresponds to resistor 192 of the above exemplary embodiments. A "second resistor" of the present disclosure corresponds to resistor 184 of the above exemplary embodiments. A "third resistor" of the present disclosure corresponds to resistor 132 of the above exemplary embodiments. A "forth resistor" of the present disclosure corresponds to resistor 139 of the above exemplary embodiments. A "first transistor" of the present disclosure corresponds to transistor 182 of the above exemplary embodiments. A "second transistor" of the present disclosure corresponds to transistor 186 of the above exemplary embodiments. A "third transistor" of the present disclosure corresponds to transistor 134 of the above exemplary embodiments. A "fourth transistor" of the present disclosure corresponds to transistor 136 of the above exemplary embodiments. A "fifth transistor" of the present disclosure corresponds to transistor 137 of the above exemplary embodiments. A "sixth transistor" of the present disclosure corresponds to transistor 138 of the above exemplary embodiment.

What is claimed is:

1. A power amplifier comprising:
   an amplification transistor which performs power amplification;
   a bias circuit which outputs a bias voltage to a base of the amplification transistor;
   a control terminal to which a control voltage is applied for controlling switching between an operating state and a stopping state of the bias circuit; and
   a bias voltage adjustment circuit connected to the control terminal,
   wherein
   the bias voltage adjustment circuit includes:
      a variable capacitance element which is connected to the control terminal and whose capacitance value decreases as the control voltage increases;
      a discharge circuit which discharges electric charge accumulated in the variable capacitance element to the control terminal; and
      a control circuit which is connected to the bias circuit and controls the bias voltage, and
   the bias voltage adjustment circuit outputs, to the bias circuit, a bias voltage adjustment signal which increases the bias voltage for a predetermined period after the control voltage is applied.

2. The power amplifier according to claim 1, wherein the capacitance value is inversely proportional to a value of the control voltage.

3. The power amplifier according to claim 1, wherein
   the variable capacitance element is a variable capacitance diode, and
   the variable capacitance diode has a cathode connected to the control terminal.

4. The power amplifier according to claim 1, wherein the bias voltage adjustment signal is generated from an output signal of the variable capacitance element.

5. The power amplifier according to claim 1, wherein
   the control circuit is formed of a first resistor, and
   the first resistor has a first end grounded and a second end connected to the bias circuit.

6. The power amplifier according to claim 1, wherein the predetermined period is a time period since the control voltage is applied until a current flowing through the amplification transistor becomes to have a constant value independent of a value of the control voltage.

7. The power amplifier according to claim 1, wherein
   the bias voltage adjustment circuit includes a time constant control circuit which sets the predetermined period, and
   the time constant control circuit is connected to the variable capacitance element and the control circuit.

8. The power amplifier according to claim 7, wherein the bias voltage adjustment signal is generated from an output signal of the time constant control circuit.

9. The power amplifier according to claim 7, wherein
   the time constant control circuit includes:
      a first transistor whose base is connected to the variable capacitance element;
      a second resistor whose first terminal is connected to an emitter of the first transistor; and
      a second transistor whose base is connected to a second terminal of the second resistor,
   a collector of the first transistor and a collector of the second transistor are connected, and
   an emitter of the second transistor is connected to the control circuit.

10. The power amplifier according to claim 1, wherein
    the bias circuit includes:
      a bias transistor which supplies the base of the amplification transistor with the bias voltage; and
      a temperature compensation circuit,
      the temperature compensation circuit having:
         a third resistor whose first terminal is connected to the control terminal and whose second terminal is connected to a base of the bias transistor;
         a third transistor whose collector and base are connected to the base of the bias transistor; and
         a fourth transistor whose collector and base are connected to an emitter of the third transistor, and whose emitter is grounded through the control circuit.

11. The power amplifier according to claim 1, wherein
    the bias circuit includes:
      a bias transistor which supplies the base of the amplification transistor with the bias voltage; and
      a temperature compensation circuit,
      the temperature compensation circuit having:
         a fifth transistor whose base is connected to a base of the bias transistor;
         a fourth resistor whose first terminal is grounded and whose second terminal is connected to an emitter of the fifth transistor; and
         a sixth transistor whose collector is connected to a base of the bias transistor and a base of the fifth transistor, whose base is connected to the emitter of the fifth transistor, and whose emitter is grounded through the control circuit.

* * * * *